(12) United States Patent
Kaushal et al.

(10) Patent No.: US 6,824,748 B2
(45) Date of Patent: Nov. 30, 2004

(54) HEATED CATALYTIC TREATMENT OF AN EFFLUENT GAS FROM A SUBSTRATE FABRICATION PROCESS

(75) Inventors: Tony S. Kaushal, Cupertino, CA (US); Shamouil Shamouilian, San Jose, CA (US); Harshad Borgaonkar, Santa Clara, CA (US); Kwok Manus Wong, San Jose, CA (US); Michael G. Chafin, San Jose, CA (US); Ashish Bhatnagar, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 589 days.

(21) Appl. No.: 09/872,254

(22) Filed: Jun. 1, 2001

(65) Prior Publication Data

US 2002/0182131 A1 Dec. 5, 2002

(51) Int. Cl.[7] .............................................. F28D 21/00
(52) U.S. Cl. ...................................... 422/198; 422/211
(58) Field of Search .................................. 422/198, 211

(56) References Cited

U.S. PATENT DOCUMENTS

| | | |
|---|---|---|
| 2,819,151 A | 1/1958 | Flemmert |
| 3,203,759 A | 8/1965 | Flemmert |
| 3,969,482 A | 7/1976 | Teller |
| 3,969,485 A | 7/1976 | Flemmert |

(List continued on next page.)

FOREIGN PATENT DOCUMENTS

| | | |
|---|---|---|
| DE | 215706 | 11/1984 |
| DE | 19526737 | 1/1997 |
| EP | 0885648 A | 12/1998 |
| EP | 09166388 A | 5/1999 |
| JP | 51129868 | 11/1976 |
| JP | 5845718 | 3/1983 |
| JP | 39768 | 2/1991 |
| JP | 10192653 | 7/1998 |
| JP | 11070322 | 3/1999 |
| JP | 11319485 | 11/1999 |

OTHER PUBLICATIONS

PCT Search Report dated Dec. 4, 2000, no PCT # avail.

U.S. patent application entitled, "Treatment of Process Gas Effluent"; filed Jul. 28, 1999; Ser. No. 09/363,302; Inventors: Kaushal, et al.

U.S. patent application entitled, "Heater for Process Gas Effluent", filed Jan. 28, 2000; Ser. No. 09/493,307; Inventors: Borgaonkar, et al.

U.S. patent application Publication No. 2002/0150527, published Oct. 17, 2002.

U.S. patent application Publication No. 2001/0031228, published Oct. 18, 2001.

*Primary Examiner*—Kiley Stoner
*Assistant Examiner*—Jonathan Johnson
(74) *Attorney, Agent, or Firm*—Janah & Associates

(57) ABSTRACT

A substrate processing apparatus has a process chamber with a substrate support, a gas supply to introduce a gas into the chamber, and a gas energizer to energize the gas in the processing of a substrate, thereby generating an effluent gas. A catalytic reactor has an effluent gas inlet to receive the effluent gas and an effluent gas outlet to exhaust treated effluent gas. A heater is adapted to heat the effluent gas in the catalytic reactor. The heated catalytic treatment of the effluent gas abates the hazardous gases in the effluent. An additive gas source and a prescrubber may also be used to further treat the effluent.

23 Claims, 10 Drawing Sheets

U.S. PATENT DOCUMENTS

| | | | |
|---|---|---|---|
| 3,983,021 A | | 9/1976 | Henis |
| 4,099,923 A | * | 7/1978 | Milberger .................... 422/80 |
| 4,206,189 A | | 6/1980 | Kosintsev et al. |
| 4,207,290 A | * | 6/1980 | Lee ............................ 422/109 |
| 4,355,003 A | * | 10/1982 | Grobel ....................... 422/206 |
| 4,479,443 A | | 10/1984 | Faldt et al. |
| 4,661,323 A | | 4/1987 | Olesen |
| 4,662,352 A | | 5/1987 | Aviles, Jr. |
| 4,753,915 A | | 6/1988 | Vogt et al. |
| 4,788,036 A | | 11/1988 | Eiselstein et al. |
| 4,954,320 A | | 9/1990 | Birmingham et al. |
| 4,966,611 A | | 10/1990 | Schumacher et al. |
| 5,137,701 A | | 8/1992 | Mundt |
| 5,151,116 A | | 9/1992 | Scholz et al. |
| 5,176,897 A | | 1/1993 | Lester |
| 5,417,934 A | | 5/1995 | Smith et al. |
| 5,439,568 A | | 8/1995 | Uchiyama |
| 5,510,066 A | | 4/1996 | Fink et al. |
| 5,584,959 A | | 12/1996 | Kimura et al. |
| 5,589,148 A | | 12/1996 | Otsuka et al. |
| 5,597,540 A | | 1/1997 | Akita et al. |
| 5,643,545 A | | 7/1997 | Chen et al. |
| 5,649,985 A | | 7/1997 | Imamura |
| 5,720,444 A | | 2/1998 | Wheeler et al. |
| 5,720,931 A | | 2/1998 | Rossin et al. |
| 5,762,893 A | | 6/1998 | Scholz et al. |
| 5,779,863 A | | 7/1998 | Ha et al. |
| 5,817,284 A | | 10/1998 | Nakano et al. |
| 5,843,288 A | | 12/1998 | Yamamoto |
| 5,858,065 A | | 1/1999 | Li et al. |
| 5,865,879 A | | 2/1999 | Lee |
| 5,914,091 A | | 6/1999 | Holst et al. |
| 5,955,037 A | | 9/1999 | Holst et al. |
| 5,965,786 A | | 10/1999 | Rostaing et al. |
| 5,977,427 A | | 11/1999 | Tamata et al. |
| 6,030,591 A | | 2/2000 | Tom et al. |
| 6,069,291 A | | 5/2000 | Rossin et al. |
| 6,153,150 A | | 11/2000 | Moore et al. |
| 6,187,072 B1 | | 2/2001 | Cheung et al. |
| 6,190,507 B1 | | 2/2001 | Whealton et al. |
| 6,426,443 B1 | | 7/2002 | Rossin et al. |
| 6,509,511 B1 | | 1/2003 | Rossin |

\* cited by examiner

HEATED CATALYTIC TREATMENT OF AN EFFLUENT GAS FROM A SUBSTRATE FABRICATION PROCESS

BACKGROUND

The present invention is related to treating an effluent gas from a process chamber.

Fluorocarbon, chlorofluorocarbons, hydrocarbon, and other fluorine containing gases are used in, or formed as a byproduct during, the manufacture of integrated circuits in process chambers. Many of these gases are toxic to humans and hazardous to the environment. In addition, they may also absorb infrared radiation and have high global warming potentials. Especially notorious are persistent fluorinated compounds or perfluorocompounds (PFCs) which are long-lived, chemically stable compounds that have lifetimes often exceeding thousands of years. Some examples of PFCs are carbon tetrafluoride ($CF_4$), hexafluoroethane ($C_2F_6$), perfluorocyclobutane ($C_4F_8$), difluoromethane ($CH_2F_2$), perfluorocyclobutene ($C_4F_5$), perafluoropropane ($C_3F_8$), trifluoromethane ($CHF_3$), sulfur hexafluoride ($SF_6$), nitrogen trifluoride ($NF_3$), carbonyl fluoride ($COF_2$) and the like. For example, $CF_4$ has a lifetime in the environment of about 50,000 years and can contribute to global warming for up to 6.5 million years. Thus it is desirable to have an apparatus or method can reduce the hazardous gas content of an effluent gas, and especially the PFCs, that may be released from the process chambers.

Perfluorocompounds are utilized in numerous semiconductor fabrication processes. For example, perfluorocompounds are used in the etching of layers on substrates, such as oxide, metal and dielectric layers. Perfluorocompounds can also be used during chemical vapor deposition processes. Additionally, process chambers can be cleaned of etch or deposition residue using perfluorocompounds. These hazardous compounds are either introduced into a process chamber or are formed as byproducts within the process chamber and may be exhausted from the chamber in an effluent gas stream.

It is desirable to minimize the introduction of such harmful gases and byproducts into the environment. It is also desirable to minimize the harmful content of the effluent gas released into the atmosphere in an efficient manner. There is a further need to reduce PFC and other harmful gases to low levels especially for industries which widely use PFCs, even though such use is a relatively small component of the overall consumption or release of PFCs in the world.

SUMMARY

An effluent gas treatment apparatus comprising a catalytic reactor having an effluent gas inlet and an effluent gas outlet, and a heater adapted to heat an effluent gas in the catalytic reactor, whereby effluent gas introduced through the effluent gas inlet is treated while flowing through the catalytic reactor to the effluent gas outlet.

A substrate processing apparatus comprising a process chamber comprising a substrate support, a gas supply to introduce a gas into the chamber, a gas energizer to energize the gas to process the substrate and thereby generate an effluent gas, and an exhaust system to exhaust the effluent gas from the chamber; a catalytic reactor having an effluent gas inlet to receive the effluent gas and an effluent gas outlet; and a heater adapted to heat effluent gas in the catalytic reactor, whereby the effluent gas introduced through the effluent gas inlet is treated while flowing through the catalytic reactor to the effluent gas outlet.

An effluent gas treatment method comprises (a) flowing an effluent gas over a catalyst, and (b) during (a), heating the effluent gas.

A substrate processing apparatus comprises a process chamber comprising a substrate support, a gas supply to introduce a gas into the chamber, a gas energizer to energize the gas in the processing of a substrate and thereby generate an effluent gas, a catalytic reactor having an effluent gas inlet to receive the effluent gas and an effluent gas outlet, and a heater adapted to heat the effluent gas in the catalytic reactor.

A method of processing a substrate comprising (a) placing a substrate in a process zone, (b) providing an energized gas in a process zone to process the substrate and thereby forming an effluent gas, (c) flowing the effluent gas over a catalyst; and (d) during (c), heating the effluent gas.

An effluent gas treatment apparatus comprising a scrubber capable of treating an effluent gas, the scrubber comprising a surface having a pH of at least about 8, a heater adapted to heat the effluent gas, and a catalytic reactor having an effluent gas inlet and an effluent gas outlet, whereby effluent gas introduced through the effluent gas inlet is treated while flowing through the catalytic reactor to the effluent gas outlet.

A substrate processing method comprising (a) placing a substrate in a process zone; (b) providing an energized gas in a process zone to process the substrate and thereby forming an effluent gas; (c) passing the effluent gas over a surface having a pH of at least about 8; (d) flowing the effluent over a catalyst; and (e) during (d), heating the effluent gas.

A substrate processing apparatus comprising a process chamber comprising a substrate support, a gas supply to introduce a gas into the chamber, a gas energizer to energize the gas to process the substrate and thereby generate an effluent gas, and an exhaust system to exhaust the effluent gas from the chamber; a catalytic reactor having an effluent gas inlet to receive the effluent gas and an effluent gas outlet; a heater adapted to heat the effluent gas in the catalytic reactor; and a controller adapted to control the heater to heat the effluent gas in the catalytic reactor to a pre-selected temperature, whereby effluent gas introduced through the effluent gas inlet is heated while flowing through the catalytic reactor to the effluent gas outlet.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 6b is a schematic sectional side view of the catalytic reactor of FIG. 6a;

FIG. 7b is a schematic sectional side view of the catalytic reactor of FIG. 7a

DESCRIPTION

Figure 1:
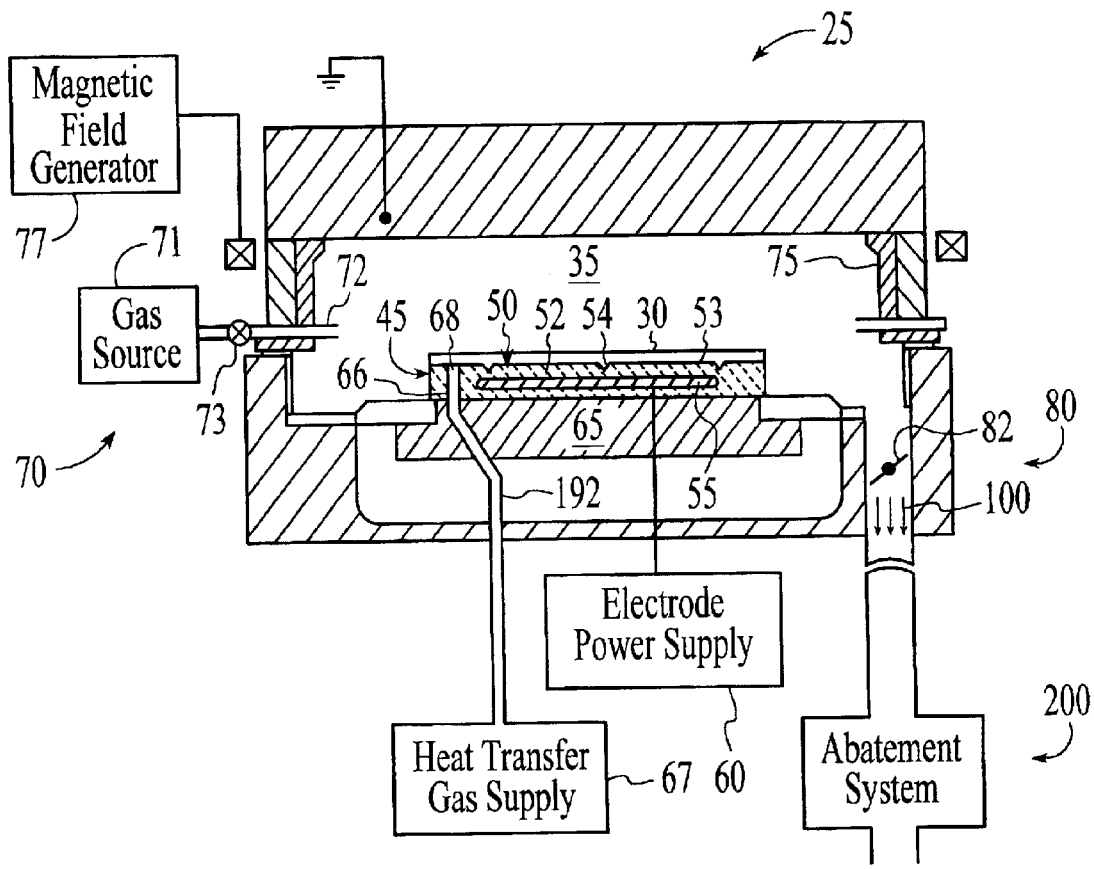
FIG. 1 is a schematic sectional side view of an exemplary processing apparatus for processing a substrate showing an abatement system in the exhaust.

The present invention relates to a gas treatment apparatus for use with a process chamber and a method of abating a hazardous gas content of effluent gas from the process chamber. An exemplary semiconductor processing apparatus, as illustrated in FIG. 1, comprises a chamber 25 such as for example, an MxP, an MxP+, or an MxP Super e chamber, commercially available from Applied Materials Inc., Santa Clara, Calif., and generally described in commonly assigned U.S. Pat. Nos. 4,842,683 and 5,215,619 to Cheng, et al; and U.S. Pat. No. 4,668,338 to Maydan, et al., all of which are incorporated herein by reference in their entireties. Such chambers can be used in a multi-chamber integrated process system as for example, described in U.S. Pat. No. 4,951,601 to Maydan, et al., which is also incorporated herein by reference in its entirety. The particular embodiment of the chamber 25 shown herein, is suitable for processing of substrates 30, such as semiconductor wafers. The embodiment is provided only to illustrate the invention, and should not be used to limit the scope of the invention.

During processing of a substrate 30, the chamber 25 is evacuated to a low pressure of less than about 500 mTorr, and the substrate 30 is transferred to a plasma zone 35 of the chamber 25 from a load lock transfer chamber (not shown) maintained at vacuum. The substrate 30 is held on a support 40, which optionally comprises a mechanical or electrostatic chuck 45. A typical electrostatic chuck 45 comprises an electrostatic member 50 comprising a dielectric layer 52 having a surface 53 adapted to receive the substrate 30. The dielectric layer 52 covers an electrode 55—which may be a single conductor or a plurality of conductors—which is chargeable to electrostatically hold the substrate 30. After the substrate 30 is placed on the chuck 45, the electrode 55 is electrically biased with respect to the substrate 30 by an electrode voltage supply 60 to electrostatically hold the substrate 30. A base 65 below the electrostatic chuck 45 supports the chuck, and optionally, is also electrically biased with an RF bias voltage. The surface 53 may have grooves 54 in which a heat transfer gas, such as helium, is held to control the temperature of the substrate 30. The heat transfer gas is provided via gas conduits 66 having one or more outlets 68 that deliver the gas to the surface 53 of the chuck 45 and that extend through one or more of the electrodes 55 and dielectric layer 52. A heat transfer gas supply 67 supplies heat transfer gas to the conduits 66 via a gas supply channel.

Process gas is introduced into the chamber 25 through a gas supply 70 that includes a gas source 71 and one or more gas nozzles 72 terminating in the chamber 25 through which gas may be introduced under the control of one or more control valves 73. The gas in the chamber 25 is typically maintained at a low pressure. A plasma is formed in the plasma zone 35 from the gas by applying electromagnetic energy, for example, to the process gas. In the chamber 25, the plasma may be capacitively generated by applying an RF voltage to the electrode 55 (which serves as the cathode electrode) and by electrically grounding the sidewalls 75 of the chamber 25 to form the other (anode) electrode. Alternatively, or additionally, an RF current may be applied to an inductor coil (not shown) to inductively couple energy into the chamber 25 to generate the plasma in the plasma zone 35. The frequency of the RF current applied to the electrode 55 or to the inductor coil (not shown) is typically from about 50 KHz to about 60 MHz, and more typically about 13.56 MHz. The capacitively generated plasma can also be enhanced by electron cyclotron resonance in a magnetically enhanced reactor in which a magnetic field generator 77, such as a permanent magnet or electromagnetic coils, that provide a magnetic field that may increase the density and uniformity of the plasma in the plasma zone 35. Preferably, the magnetic field comprises a rotating magnetic field with the axis of the field rotating parallel to the plane of the substrate 30, as described in U.S. Pat. No. 4,842,683.

Effluent gas 100 comprising process gas and process byproducts is exhausted from the chamber 25 through an exhaust system 80 capable of achieving a minimum pressure of about $10^{-3}$ mTorr in the chamber 25. The exhaust system 80 comprises an exhaust tube 85 that leads to one or a plurality of pumps (not shown), such as roughing and high vacuum pumps, that evacuate the gas in the chamber 25. A throttle valve 82 is provided in the exhaust tube 85 for controlling the pressure of the gas in the chamber 25.

During operation of the chamber 25 in a typical semiconductor process, a semiconductor substrate 30 may be placed on the support 40 in the process chamber 25, and a process gas comprising fluorine-containing gas such as $CF_4$, $C_2FO$, $C_3F_8$, $CHF_3$, $SF_6$, $NF_{31}$ $COF_2$, $CH_3F$, $C_4F_8$, $CH_2F_2$, $C_4F_6$ and the like, is introduced into the process zone 35 through the process gas distributor 72. The process gas is energized by the gas energizer 60 in the chamber 25 to, for example, process the substrate 30 in an electromagnetically energized plasma gas or a microwave energized gas. Alternatively, the gas may be energized in a remote chamber. During and/or after processing of the substrate 30, the effluent gas stream 100 comprising process gas and gaseous byproducts are exhausted from the process chamber 25 and into the conduit 210 of the catalytic abatement system 200. The fluorine-containing gas can also be used in a process chamber cleaning process. Also, an optical endpoint measurement technique is often used to determine completion of a process in the chamber 25 by measuring a change in light emission intensity of a gas species in the chamber 25 or by measuring the intensity of light reflected from a layer being processed on the substrate 30.

To abate hazardous and undesirable gases, such as PFC gases, from the effluent gas 100, an additive gas may be added to the effluent gas 100. For example, a hydrogen and oxygen containing gas or gases, such as $H_2O$, can be added to an effluent gas 100 containing $CF_4$ to convert the $CF_4$ to $CO_2$ and HF. It is believed that this reaction can be shown by:

$$CF_4 + 2H_2O \rightarrow CO_2 + 4HF$$

The $CO_2$ may be exhausted, and the HF may be disposed of by dissolving it in water; however, it is still highly corrosive and toxic. Hydrogen and oxygen can be used to breakdown other PFCs as well with minor adjustments. For example, it is believed that when $C_2F_6$ is reacted with $H_2O$ and $O_2$ the following reaction occurs:

$$2C_2F_6 + 6H_2O + O_2 \rightarrow 4CO_2 + 12HF.$$

Thus, it may be desirable to add gases such as $H_2O$ and/or $O_2$ or other reactive gases to the effluent gas 100 to abate the hazardous gases in the effluent gas. As disclosed in U.S. patent application Ser. No. 09/363,302 filed on Jul. 28, 1999, and entitled "Treatment of Process Gas Effluent gas," which is incorporated herein by reference in its entirety, the use of a catalyst encourages these exemplary abatement reactions.

Figure 2:
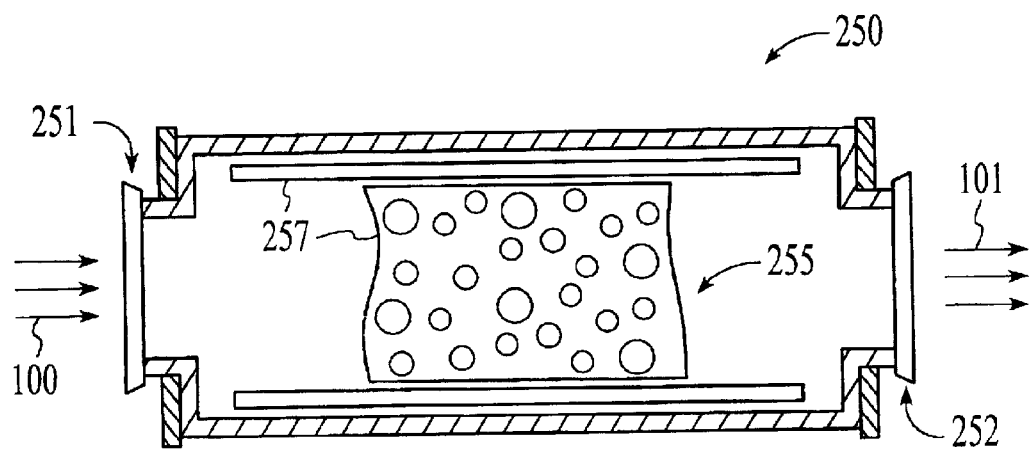
FIG. 2 is a schematic sectional side view of a version of a catalytic reactor for use in abating hazardous gases from an effluent gas.

In one version, the effluent gas 100 may be passed over a catalyst to abate hazardous and undesirable gases from the effluent gas 100. The catalyst may be housed in a catalytic reactor 250 through which the effluent gas 100 with additive gas flows, an example of which is shown in FIG. 2. A vacuum pump draws the effluent gas 100 through the catalytic reactor 250, and optionally, flow controllers such as throttle valves may be used to regulate the flow of effluent gas through the catalytic reactor 250. In addition, the effluent gas 100 may be mixed upstream with a reactant such as an additive gas or liquid, as discussed above, and the mixture of gases passed through the catalytic reactor 250 through the inlet 251 and out of the outlet 252 to provide abated gas 101 exiting the catalytic reactor that may be exhausted to the atmosphere or easily treated for safe exhaustion.

The catalytic reactor 250 may comprise one or more catalytic surfaces 257 that catalyze a reaction for reducing the hazardous gas content in the effluent gas. The catalytic surface 257 may be in the form of a structure made from catalytic material or supporting a finely divided catalyst, a bed of foam or pellets, or a coating on a wall or component of the catalytic reactor 250. For example, the catalytic surface 257 may comprise surfaces of a support structure comprising a honeycomb member with the catalyst embedded therein to form a high surface area member 255 over and through which the effluent gas 100 passes as it flows from the inlet 251 to the outlet 252. The catalytic surface 257 may be on, for example, a structure comprising a ceramic material, such as cordierite, $Al_2O_3$, alumina-silica, mullite, silicon carbide, silicon nitride, zeolite, and their equivalents; or may comprise a coating of materials, such as $ZrO_2$, $Al_2O_3$, $TiO_2$ or combinations of these and other oxides. The catalytic surface 257 may also be impregnated with catalytic metals, such as Pt, Pd, Rh, Cu, Ni, Co, Ag, Mo, W, V, La or combinations thereof or other materials known to enhance catalytic activity. The catalytic surface 257 reduces the activation energy of the abatement reactions and thereby increases the reaction rate. For example, the activation energy for the breakdown of $CF_4$ may be reduced to about 135 kJ/mol by passing the gas over a suitable catalyst. In another example, the activation energy for $C_2F_6$ may be lowered to about 98 kJ/mol. The lower levels of activation energy allow for reduced PFC content even at low temperatures, thereby reducing energy consumption, and improving reaction efficiency.

Figure 3A:
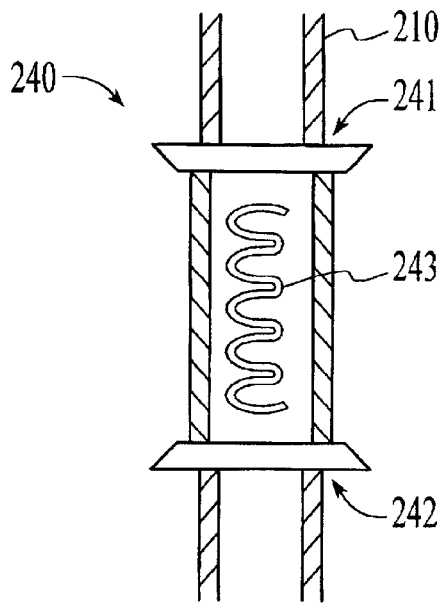
FIGS. 3a and 3b are sectional schematic side views of versions of LA heaters which can be used to heat an effluent gas.
Figure 3B:
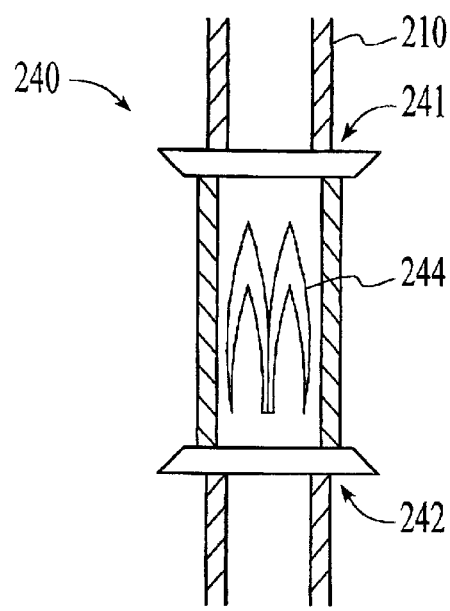

The effluent gas 100 and additive mixture may be heated by a heater 240, before, during or after passing the effluent gas 100 over the catalyst. As shown for example in FIGS. 3a and 3b, in one version, the heater 240 has an inlet 241 and an outlet 242 and may comprise laterally extending internal coils 243 or longitudinally extending internal coils 244. The effluent gas may pass directly over and contact the coils 243, 244. Heat is transferred from the coils 243, 244 primarily by convection to the effluent gas 100 and subsequently by conduction through the effluent gas 100. The coils may be maintained at a temperature of about 800 to about 870° C. This allows for an inlet 241 to outlet 242 temperature change in the effluent gas of about 200 to about 250° C. For optimum abatement of PFC gases in the catalytic abatement system 200, a temperature of about 700° C. is desired. The effluent gas 100 can be raised to a temperature of about 700° C. by providing multiple heaters 240 in series along the conduit 210 or by forming a loop in the conduit 210 to recirculate the effluent gas 100 through the heater 240 multiple times. Alternatively, the heater may comprise a convoluted gas flow path, such as that disclosed in U.S. patent application Ser. No. 09/493,307 filed on January 28th, 2000 and incorporated herein by reference in its entirety.

In one version, the heater 240 may be in or around at least a portion of the catalytic reactor 250. For example, in a version shown in FIG. 4, the catalytic reactor 250 may comprise a heating element 303 which heats the effluent gas 100 as it passes from the inlet 251 to the outlet 252 of the catalytic reactor 250. As shown, the heating element 303 substantially surrounds the catalytic reactor 250 which houses the catalytic material 257. Alternatively, the heating element 303 may extend over a portion of the catalytic reactor 250 or the catalytic material 257 may be confined to a portion of the heated catalytic reactor 250. In another version, the heater 240 may comprise a heating element 303 before and/or after the catalytic reactor 250 and a heating element 303 at least partially in or around the catalytic reactor 250.

Figure 4:
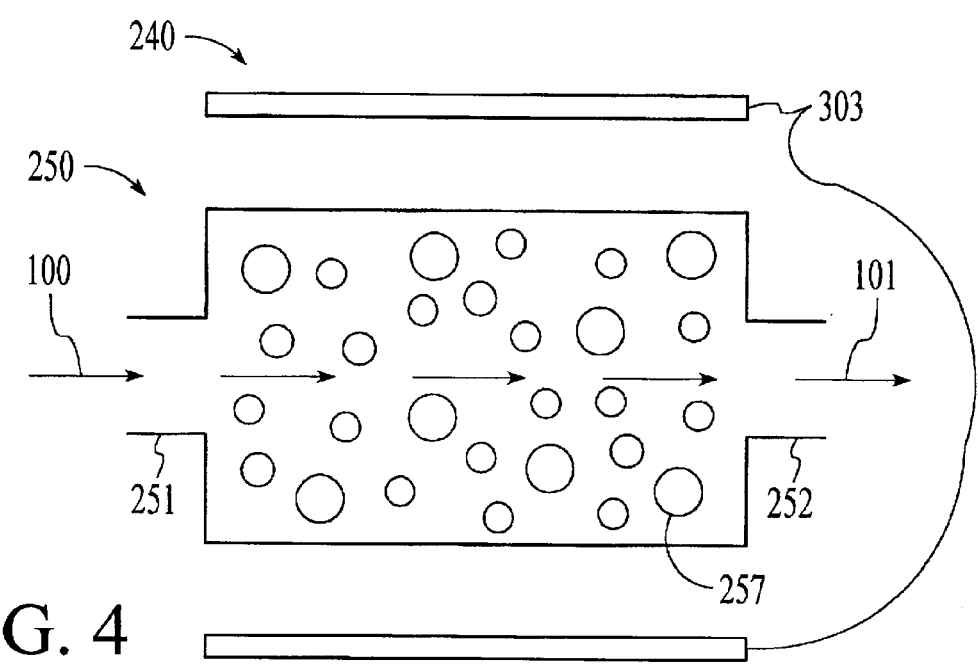
FIG. 4 is a schematic sectional side view of a version of a catalytic reactor comprising a heater.

The heating element 303 may heat the effluent gas 100 to a suitable temperature to enhance treatment of the gas, for example, to increase the rate of catalytic abatement of the gas. For example, the heating element 303 may heat the effluent gas 100 at least about 700° C. The heating element 303 may comprise, for example, one or more heating coils or ceramic heating materials. The heating element 303 may comprise any suitable shape, such as for example a cylindrical shape, which provides sufficient heat to the effluent gas 100. In one version, as shown in FIG. 4, the heating element 303 may be arranged about the exterior of the catalytic reactor 250, for example, the heating element 303 may surround at least a portion of the catalytic reactor 250. In another version, the heating element 303 may be arranged within the catalytic reactor 250, for example, the heating element 303 may be placed within the effluent gas flow path.

Figure 5:
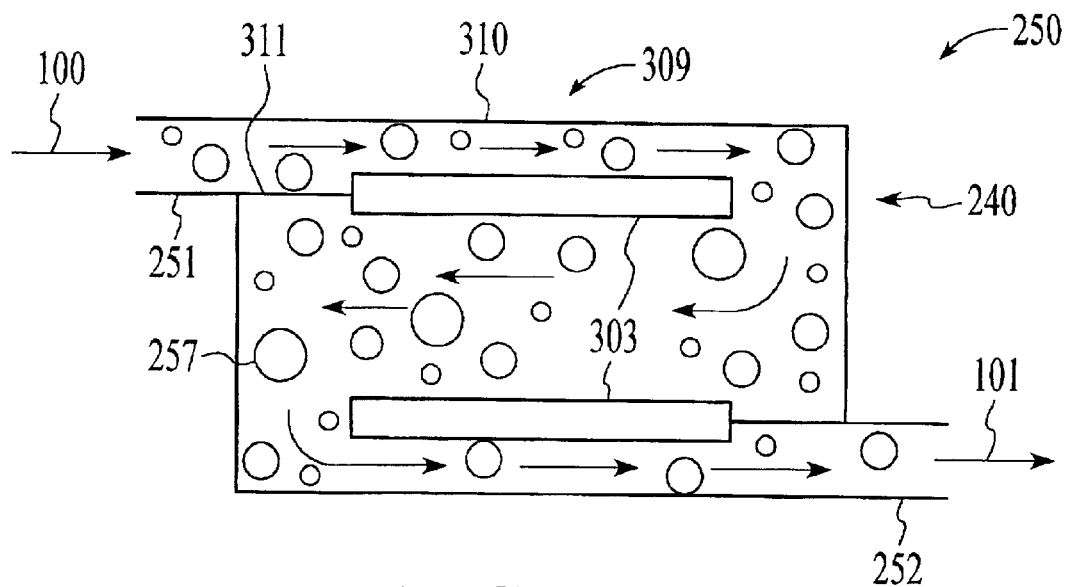
FIG. 5 is a schematic sectional side view of a version of a catalytic reactor comprising a convoluted gas flow path.

In one version, the catalytic reactor 250 may comprise a convoluted gas flow path to provide more efficient treatment of the effluent gas 100. By convoluted gas flow path, it is meant any gas flow path through a device, such as the catalytic reactor 250, in which the distance traveled by the gas is greater than the length of the device. As the effluent gas 100 travels a greater distance in the catalytic reactor 250 having a convoluted gas flow path, the residence time of the effluent gas 100 within the catalytic reactor 250 is increased. Thus, the gas flow path of a catalytic reactor 250 may be convoluted, for example, so that duration in which the effluent gas 100 flows past a catalytic surface 257 of the reactor 250 may be increased, or the duration during which the effluent gas 100 is heated may be increased, or both. For example, the gas flow path may be convoluted such that the gas spends more time per unit length of the catalytic reactor 250 in a heated portion of the catalytic reactor 250 than in a catalytic reactor 250 comprising a non-convoluted gas flow path. Accordingly, in one version, as shown in FIG. 5, a wall 309 of the catalytic reactor 250 may define an effluent gas flow path, such as a convoluted gas flow path. For example, the wall 309 may comprise one or more of an outer wall 310 and internal wall 311 which cooperate to define a convoluted gas flow path, such as for example an s-shaped or serpentine gas flow path as shown in FIG. 5.

Also, as shown in FIG. 5, the heater 240 may comprise one or more heating elements 303 that are positioned within the catalytic reactor 250 having the convoluted gas flow path. In the version shown, the gas flow path allows for the effluent gas to pass across or through the heating element 303 three times, thereby increasing the heating efficiency of the heater 240. Afternatively, the heating elements 303 may be positioned around the catalytic reactor 250 with the convoluted gas flow path providing multiple passes therethrough.

Figure 6A:
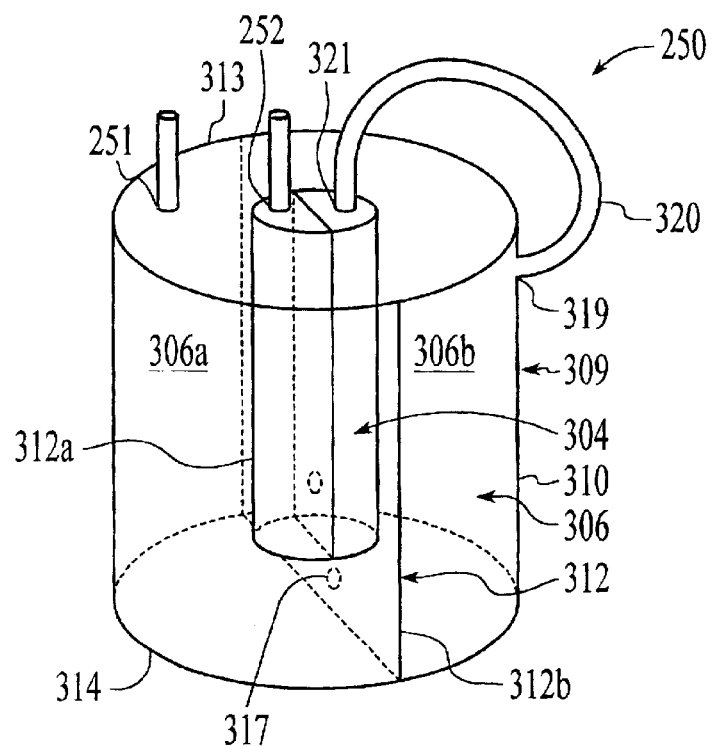
FIG. 6a is a schematic view of another version of a catalytic reactor comprising a convoluted gas flow path.
Figure 6B:
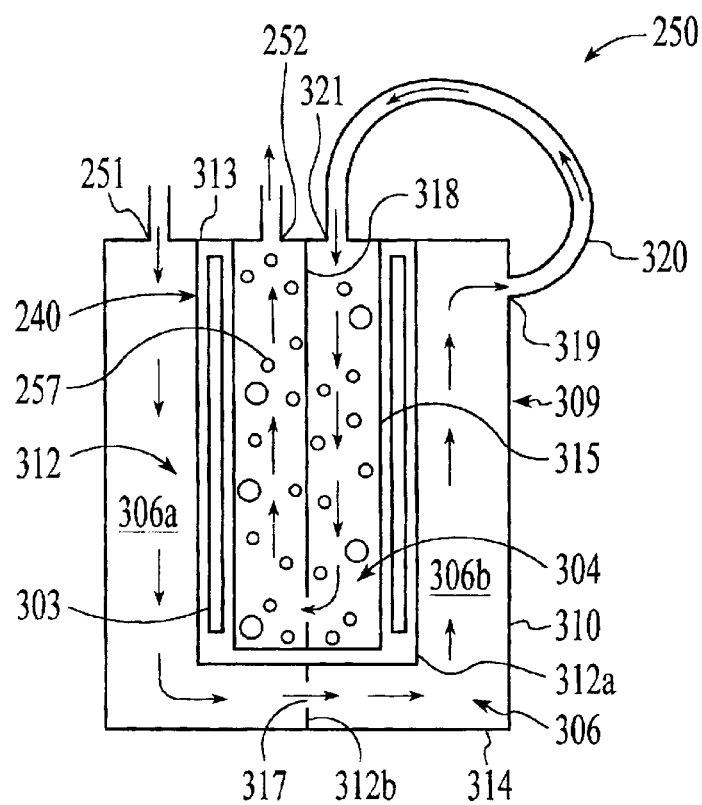
Figure 7A:
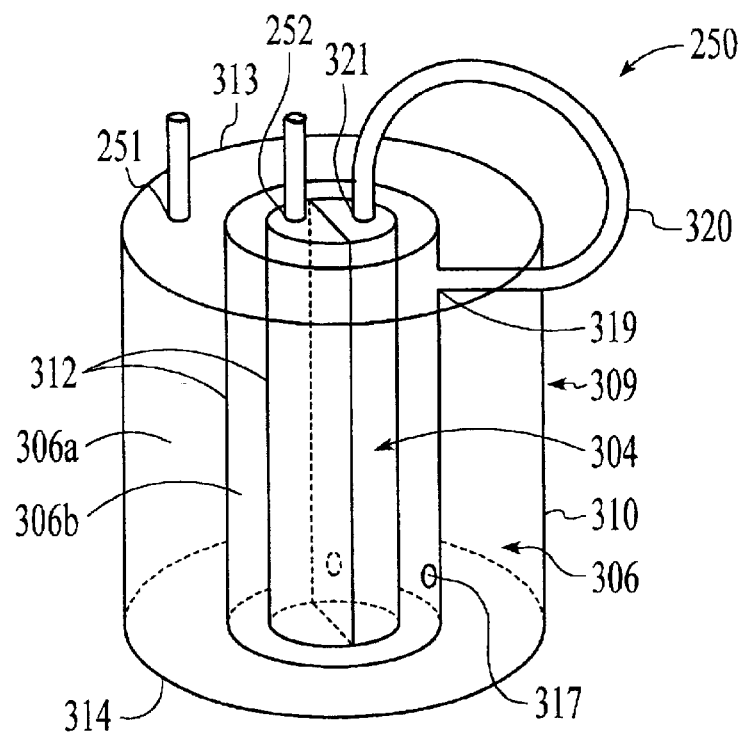
FIG. 7a is a schematic view of another version of a catalytic reactor comprising a convoluted gas flow path.
Figure 7B:
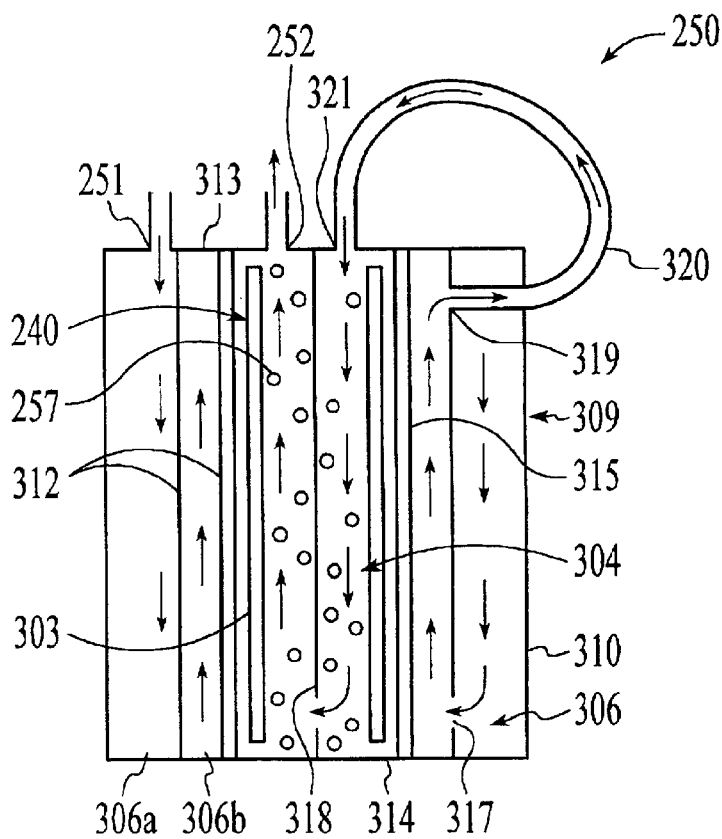

Other versions of a catalytic reactor 250 comprising a convoluted gas flow path are illustrated in FIGS. 6a, 6b, 7a and 7b. The convoluted gas flow path is defined by a catalytic reactor wall 309, comprising the outer wall 310 of the catalytic reactor and one or more internal walls 312 which may partition, or otherwise direct the flow of gas in, the catalytic reactor 250. The catalytic reactor 250 illustrated in FIGS. 6a, 6b, 7a and 7b comprises an inner catalytic chamber 304 comprising catalytic material and a outer region 306 about the catalytic chamber 304. The catalytic chamber 304 may also comprise a convoluted gas flow path as shown in FIGS. 6a, 6b, 7a and 7b. The outer region 306 may be defined by the outer wall 310 of the catalytic reactor 250 and may comprise a suitable geometry, such as for example cylindrical, spherical or rectangular geometries. FIGS. 6a, 6b, 7a and 7b illustrate a catalytic reactor 250 comprising an outer region 306 which comprises a cylindrical geometry. The internal walls 312 may comprise any number of suitable geometries such as cylindrical, planar, and rectangular geometries or any combination thereof. In one version, as shown in FIGS. 6a and 6b, the internal walls 312 comprise a cylindrical portion 312a about the catalytic chamber 304 as well as a planar portion 312b extending between the cylindrical portion 312a to the outer wall 310 of the catalytic reactor 250. In this version, the internal walls 312 partition the outer region about a central axis to divide the outer region 306 into semi-cylindrical regions 306a and 306b. Alternatively, the internal walls 312 may partition the outer region 306 about a central axis to divide the outer region 306 into a plurality of segments, such as for example in thirds or fourths. In another version, as shown in FIGS. 7a and 7b, the internal walls 312 may comprise one or more cylindrical walls which radially partition the outer region 306 into an outer cylindrical region 306a and inner cylindrical region 306b. Effluent gas entering the outer region 306 takes a convoluted gas flow path by flowing through the outer region 306a and into the inner region 306b by passing through an opening 317 in the internal wall 312. The effluent gas 100 may then flow into the catalytic chamber 304.

The heater 240 may comprise one or more heating elements 303 within the catalytic reactor 250, around the catalytic reactor 250, or both. As shown in FIGS. 6b and 7b, the heater 240 may be adapted to pre-heat the effluent gas 100 in the outer region 306 before it is introduced into the catalytic chamber 304 and to further heat the effluent gas 100 in the catalytic chamber 304. In one version, the heating element 303 may be disposed within the catalytic chamber 304, as shown in FIG. 7b. In this version, the effluent gas in the outer region 306 is heated by conduction of heat from the heating element 303 through any walls separating the catalytic chamber 304 from the outer region 306, such as for example the outer wall 315 of the catalytic chamber 304 and internal walls 312, and the subsequent convective heating of the effluent gas 100 in the outer region 306. In another version, the heating element 303 may be disposed between an outer wall 315 of the catalytic chamber 304 and the internal wall 312, as shown in FIG. 6b. In this version, the effluent gas within the catalytic chamber 304 and the outer region 306 are both convectively heated by heat conducted from the heating element 303 through the outer wall 315 of the catalytic chamber 304 and the internal wall 312 of the outer region 306. In another version, the heating element 303 may be disposed within or about the outer region 306 (not shown). The heating element 303 may be adapted to heat the effluent gas to a preselected temperature. For example, the heating element 303 may be adapted to heat the effluent gas 100 to at least about 700° C.

In operation, effluent gas 100 may enter the catalytic reactor 250 comprising the outer region 306 through an inlet 251 into a first segment 306a. In the version shown in FIGS. 6a and 6b, the first segment 306a comprises a first half of the outer region 306. In the version shown in FIGS. 7a and 7b, the first segment 306a comprises an outer cylindrical segment. In either version, transfer of the effluent gas 100 to the next segment of the outer region 306 may occur either externally through a conduit (not shown) or internally through an outlet 317 in the internal wall 312 (as shown). The effluent gas may exit the first segment through outlet 317 and may be transferred into the second segment 306b. In the version shown in FIGS. 6a and 6b, the second segment 306b comprises a second half of the outer region 306. In the version shown in FIGS. 7a and 7b, the second segment comprises an inner cylindrical segment. The heating element 303 heats the effluent gas passing through the segments 306a,b. The gas flowing through the second segment 306b may exit the segment either internally (not shown) or externally through an outlet 319 leading to gas transfer conduit 320 (shown).

In one version, the effluent gas 100 may pass through multiple segments before entering the catalytic chamber 304. For example, the cylindrical shell 306 may be partitioned by internal walls 312 into several segments such as for example, an inner, a middle and an outer cylindrical segment. Additionally, the effluent gas 100 may flow through the segments in any suitable order, such as for example, from a outer cylindrical segment to a more inner cylindrical segment or in an alternating fashion among more outer and more inner segments.

Heated effluent gas 100 from the outer region 306 may be transferred by the gas transfer conduit 320 into the catalytic chamber 304 via a gas inlet 321 for treatment of the effluent gas 100. Optionally, a sieve may be placed before the gas inlet 321 to filter any unwanted particles from the effluent gas before it enters the catalytic chamber 304. The catalytic chamber 304 may comprise catalytic material such as for example the high surface area member 255 with catalytic surfaces 257 and gas in the catalytic chamber 304 may be heated by the heating member 303 to provide treatment, such as catalytic abatement, of the effluent gases 100.

Figure 8:
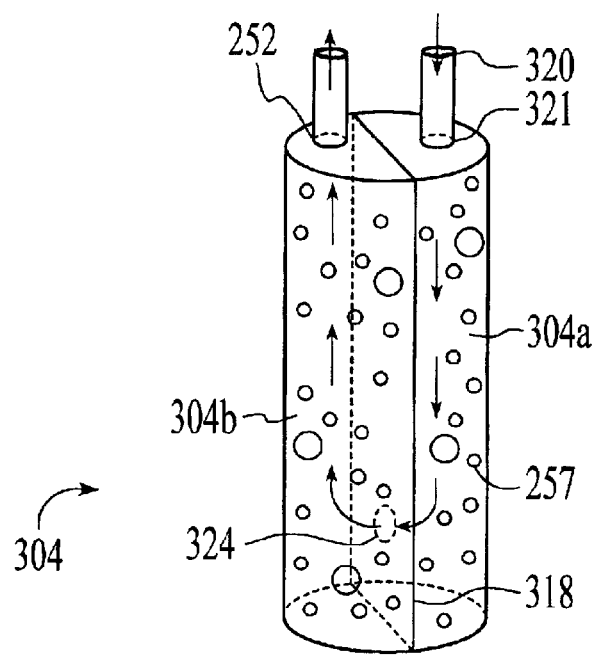
FIG. 8 is a schematic view of a catalytic chamber.

In one version, the catalytic chamber 304 may comprise a convoluted gas flow path therein. FIG. 8 shows an exemplary version of a convoluted gas flow path in which the catalytic chamber 304 is segmented by an internal wall 318 such that the chamber 304 is split substantially in half. In this version, the effluent gas 100 which enters the catalytic chamber 304 is constrained by the shape of the internal wall 318 and outer wall 315 to flow through a first portion 304a of the catalytic chamber 304 before entering a second portion 304b of the catalytic chamber 304. The gas may be delivered to the second portion 304b either through a conduit 324, such as internal inlet (as shown) or an external conduit (not shown). In another version, the catalytic chamber 304 may comprise any number of segments 304a,b that provide for a convoluted effluent gas flow. The catalytically treated effluent gas 101 may exit the catalytic chamber 304 via the gas outlet 252 and may be transferred to a scrubbing chamber or other type of post-treatment chamber.

In any of these versions, catalytic material provided for catalytic abatement of the effluent gas need not be restricted to the inside of the catalytic chamber 304. The catalytic material may be placed in any suitable location within the catalytic reactor 250, such as for example within the outer region 306.

Figure 9:
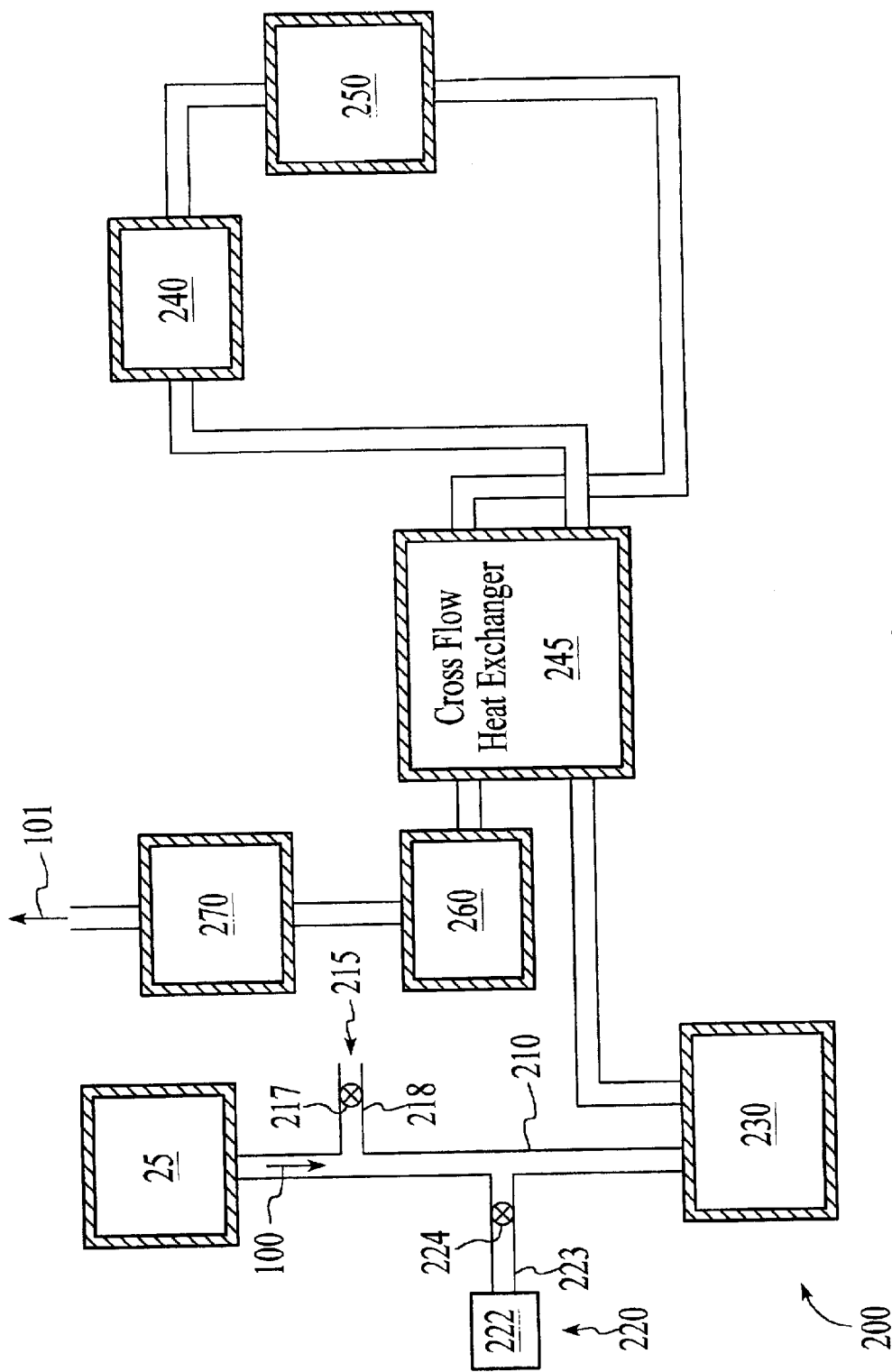
FIG. 9 is a schematic of a version of an abatement system.

In one version, the catalytic reactor 250 is part of a catalytic abatement system 200. One embodiment of a catalytic abatement system is shown in FIG. 9. A conduit 210 is sealingly engaged to the exhaust system 80 of chamber 25 so that effluent gas 100 comprising, for example, hazardous PFC gases from process chamber 25, flows into conduit 210. The conduit 210 delivers the effluent gas 100 through the catalytic abatement system 200. The catalytic abatement system may comprise, in general, one or more of a flow regulating system 215, an additive gas supply 220, a scrubber 230 (which may be a prescrubber, i.e., located before a catalytic reactor 250), a heating element 240, the catalytic reactor 250, a cooling system 260 and a postscrubber 270 (which is located after the catalytic reactor 250)

The flow regulating system 215 comprises a valve 217 on an inlet tube 218 in communication with the conduit 210 to allow air or other non-reactive gases to be introduced into the effluent gas stream 100 and to allow adjustment of the pressure within the conduit 210. Control of the pressure of the effluent gas stream 100 is needed to provide adequate flow rates through the catalytic abatement system 200.

Appropriate additive gases, such as $H_2O$ and $O_2$, may be introduced into the effluent gas 100 by any one of the flow regulating system 215, the additive gas supply 220, and/or the prescrubber 230. For example, a suitable additive gas supply includes a tube 223 for communicating additive gas or fluid from a gas source 222 to the conduit 210 under the control of a valve 224. Additives that react with the hazardous gases in the effluent gas 100 to abate the hazardous gases are added. For example, in one embodiment, PFCs are chemically broken down by adding $H_2O$ to the effluent gas 100 in a volumetric concentration of from about 0.1% to about 10%, and more preferably about 3 percent. Other additive gases, such as oxygen, may also be added to the effluent gas either as $O_2$ or by adding air or other additives that release oxygen containing species or compounds in the hazardous gas. Alternatively or additionally, $N_2$ can be added. To minimize the formation of undesirable products, such as CO, the preferred additives are $O_2$ and/or air.

The prescrubber 230 may also be provided to add the additives in conjunction with or as an alternative to the additive gas supply 220. The pre-scrubber 230 may also be used to treat the effluent gas 100 before it is introduced into the catalytic reactor 250 to remove gaseous or particulate components of the effluent gas 100 that can damage the catalytic reactor 250 or make it less effective. For example, when $SiF_4$, or other silicon species and/or fluorine species, are present in the effluent gas 100, the species can potentially deactivate the catalyst or form deposits on the catalyst by breaking up in the presence of moisture and depositing silicon. The $SiF_4$ vapor is often generated, for example, during oxide etching processes in the chamber 25. The prescrubber 230 reacts $SiF_4$ with a scrubbing fluid, for example water, to reduce the content thereof in the effluent gas 100. It is believed that water reacts with the $SiF_4$ vapor as follows:

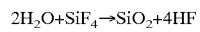

$$2H_2O+SiF_4 \rightarrow SiO_2+4HF$$

The resultant $SiO_2$ and HF products are more easily removable from the effluent gas 100. The HF may be dissolved in water and the $SiO_2$ may be removed by filtering. The removal of $SiF_4$ extends the life of the catalytic material in the catalytic reactor 250. Preferably, the size and process conditions in the prescrubber 230 are selected to remove substantially all of the $SiF_4$ from the effluent gas. The prescrubber 230 may also allow $H_2O$ or other such additive gases to be added to the effluent gas 100 in sufficient quantities to complete the hazardous gas reaction in the catalytic reactor 250. When the system is used to abate effluent gas 100 that does not contain significant quantities of catalyst contaminants such as $SiF_4$, the prescrubber 230 may be removed from the system. Versions of prescrubbers 230 that introduce $H_2O$ into the effluent gas 100 are disclosed in U.S. patent application Ser. No. 09/363,302 filed on Jul. 28, 1999 and U.S. patent application Ser. No. 09/435,119, filed on Nov. 5, 1999 both of which are incorporated herein by reference in their entireties.

Figure 10:
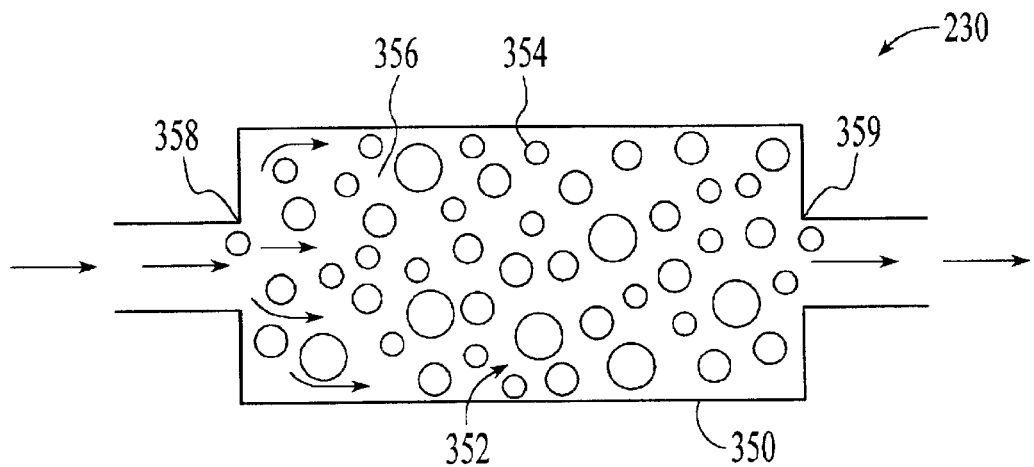
FIG. 10 is a sectional schematic side view of a pre-scrubber.

In another version, the prescrubber 230 may scrub the effluent gas 100 without injecting scrubbing fluid. For example, the prescrubber 230 according to this version may comprise a chamber 350 housing a material 352 containing or coated with a scrubbing fluid, as shown in FIG. 10. In one version the material 352 may comprise one or more beads 354. An effluent gas 100 passing over a surface of the material 352, for example a surface of a bead 354, may react with the material 352, thereby removing unwanted components from the effluent gas 100, or the effluent gas 100 may obtain additives from the material 352. The additives provided by the material 352 may comprise, for example, one or more of hydrogen species and oxygen species. The bead 354 may be formed of a suitable material, for example, a polymeric or ceramic material. In one version, the bead 354 is formed of a basic material and has a pH of at least about 8. The bead 354 may also comprise moisture, for example, the bead 354 may be at least partially moistened with a solution comprising one or more of water and a basic material. In one version, the bead 354 may comprise at least a 3% moisture content, for example, the bead may comprise a moisture content of from at least about 3% to about 10%.

Effluent gas 100 may enter the prescrubber chamber 350 comprising the material 352 through an effluent gas inlet 358. In the version of FIG. 10, the effluent At gas 100 may pass over the surface of a bead 354 in the chamber 350 as the effluent gas 100 travels from the effluent gas inlet 358 to an effluent gas outlet 359. In one version, a plurality of beads 354 may be stacked in the chamber 350 to form narrow passageways 356, through which the effluent gas 100 may pass, and which may All constrain the effluent gas 100 to pass within close proximity of the beads 354. The bead 354 may also comprise a large surface area over which effluent gas 100 may pass. The bead 354 may be sized according to the desired bead surface area and the desired size of the narrow passageways 356. In one version, a number of beads 354 of different sizes may be provided, with the beads ranging in size of from about 1 cm to about 3 cm. Effluent gas 100 which passes over the surface of a bead 354 may react with components of the bead 354, for example with water or the basic material, thereby removing unwanted components of the effluent gas 100. The bead 354 may also provide a gas additive source, for example one or more of hydrogen species and oxygen species, such as water, to the effluent gas 100 as it is flown over the bead 354 in the pre-scrubber 230.

Figure 11:
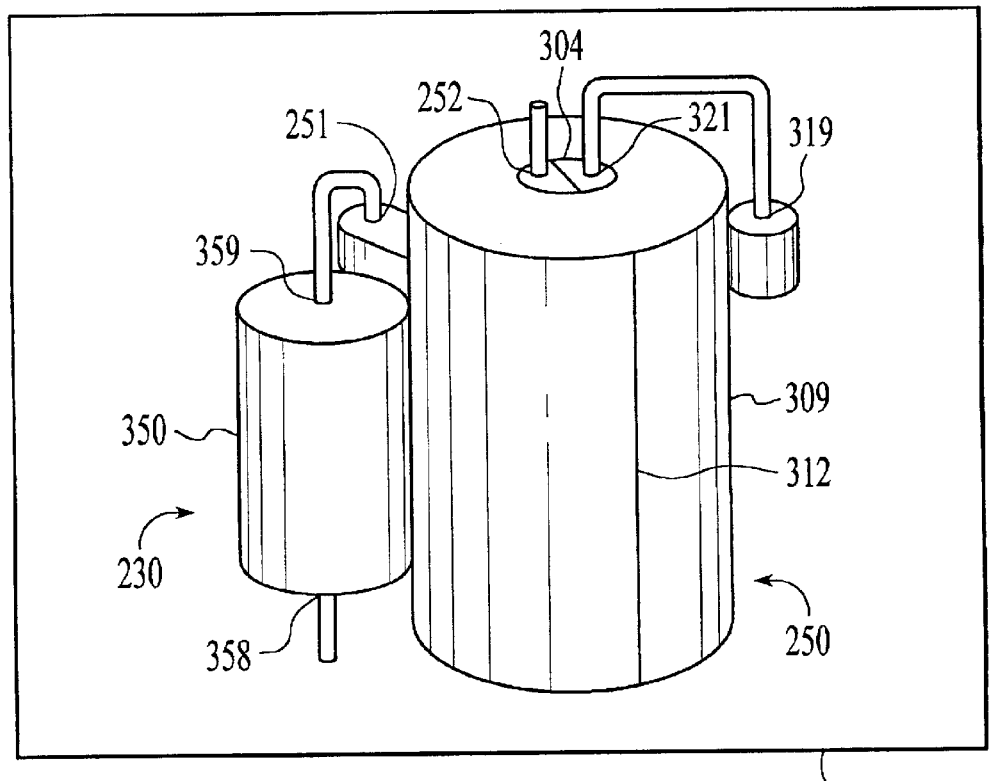
FIG. 11 is a schematic of a compact unit comprising a prescrubber and catalytic reactor.

In one version, the prescrubber 230 and catalytic reactor 250 may be arranged in a compact unit 300 comprising a casing 299 about the prescrubber 230 and catalytic reactor 250, as shown in FIG. 11. The catalytic reactor 250 and prescrubber 230 may be arranged in proximity to one another such that the compact unit 300 may take up a reduced amount of space. Also, the exhaust system 80 may be better able to draw the effluent gas 100 through the prescrubber 230 and catalytic reactor 250 when the prescrubber 230 and catalytic reactor 250 are arranged near each other in the compact unit 300. In one version, the prescrubber 230 and catalytic reactor 250 may be arranged such they are contained within a volume of less than about 5 liters and even less than about 3 liters. By arranging the prescrubber 230 and a heated catalytic reactor 250 near each other within the unit 300, the effluent gas 100 may undergo the processes of prescrubbing, heating, and catalytic abatement within a reduced amount of space.

Figure 12:
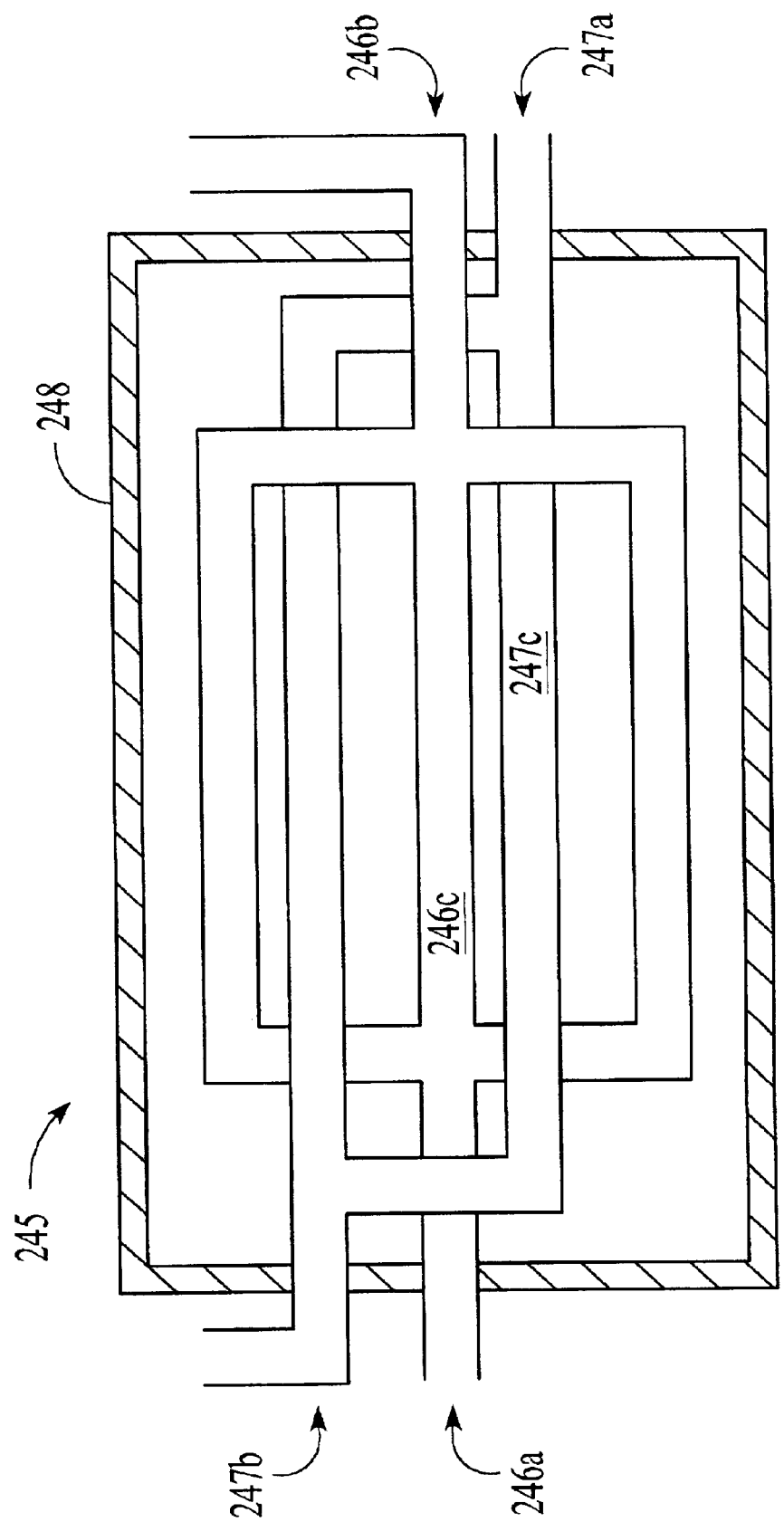
FIG. 12 is a schematic sectional side view of a version of a cross-flow heat exchanger.

The catalytic abatement system 200 may optionally comprise a heat exchanger 245 that may be provided within or external to the compact unit 300. FIG. 12 shows an embodiment of a cross-flow heat exchanger 245 that includes an effluent gas inlet 246a, and effluent gas outlet 246b, an abated effluent gas inlet 247a, and an abated effluent gas outlet 247b. The cool and fresh effluent gas 100 and the heated and abated effluent gas 101 flow past each other and exchange heat. This raises the temperature of the fresh effluent gas 100 and also lowers the temperature of the abated effluent gas 101. Effluent gas 100 enters the heat exchanger 245 through inlet 246a and is dispersed into multiple channels 246c. Abated effluent gas 101 enters the heat exchanger 245 through inlet 247a and is dispersed into multiple channels 247c which are adjacent and capable of transferring heat to channels 24c. The abated effluent gas channels 247c lose heat to the effluent gas channels 246c and the temperatures of the effluent gas 100 and the abated effluent gas 101 are brought closer to one other. An insulating material 248 may surround the heat exchanger 245 to prevent the loss of heat to the atmosphere and to increase the efficiency of the heat exchanger 245. The heat exchanger 245 is also preferably made of nickel-based alloys, such as Inconel, especially for corrosion resistance to the HF; and because it is easily sealable as discussed below.

The abated effluent gas 101 may also be cooled before it is scrubbed and exhausted. In one embodiment, the cooling system 260 comprises a fluid cooling system such as a cold water quenching system that sprays cold water to cool the abated effluent gas 101, as the effluent gas passes through the system. Other cooling systems, such as refrigerant systems, may alternatively be used.

The abated effluent gas 101 may then be introduced into a postscrubber 270 having a reactor where the byproducts of the abated effluent gas 101 are dissolved in a solvent. The type of solvent used in the scrubber depends upon the nature of the byproduct present in the abated gas. For example, acidic byproducts, such as HF or HCl, may be dissolved in water to form an acidic solution that is more easily disposed. It should be noted that acidic byproducts such as HF may be produced in both the prescrubber 230 and catalytic reactor 250. The presence of HF in the effluents 100,101 may pose safety concerns and handling difficulties because HF is toxic and the operator should not come in contact with the HF. Also, HF is highly corrosive, particularly at elevated temperatures and in the presence of moisture and oxygen. It has been discovered that nickel-based alloys, for example Inconel 600 or 625™ available from Inco Corporation in Huntington, W. Va., provide excellent corrosion resistance in the catalytic abatement system 200 environment and may be reliably sealable to prevent the unwanted escape of HF from the system.

Figure 13:
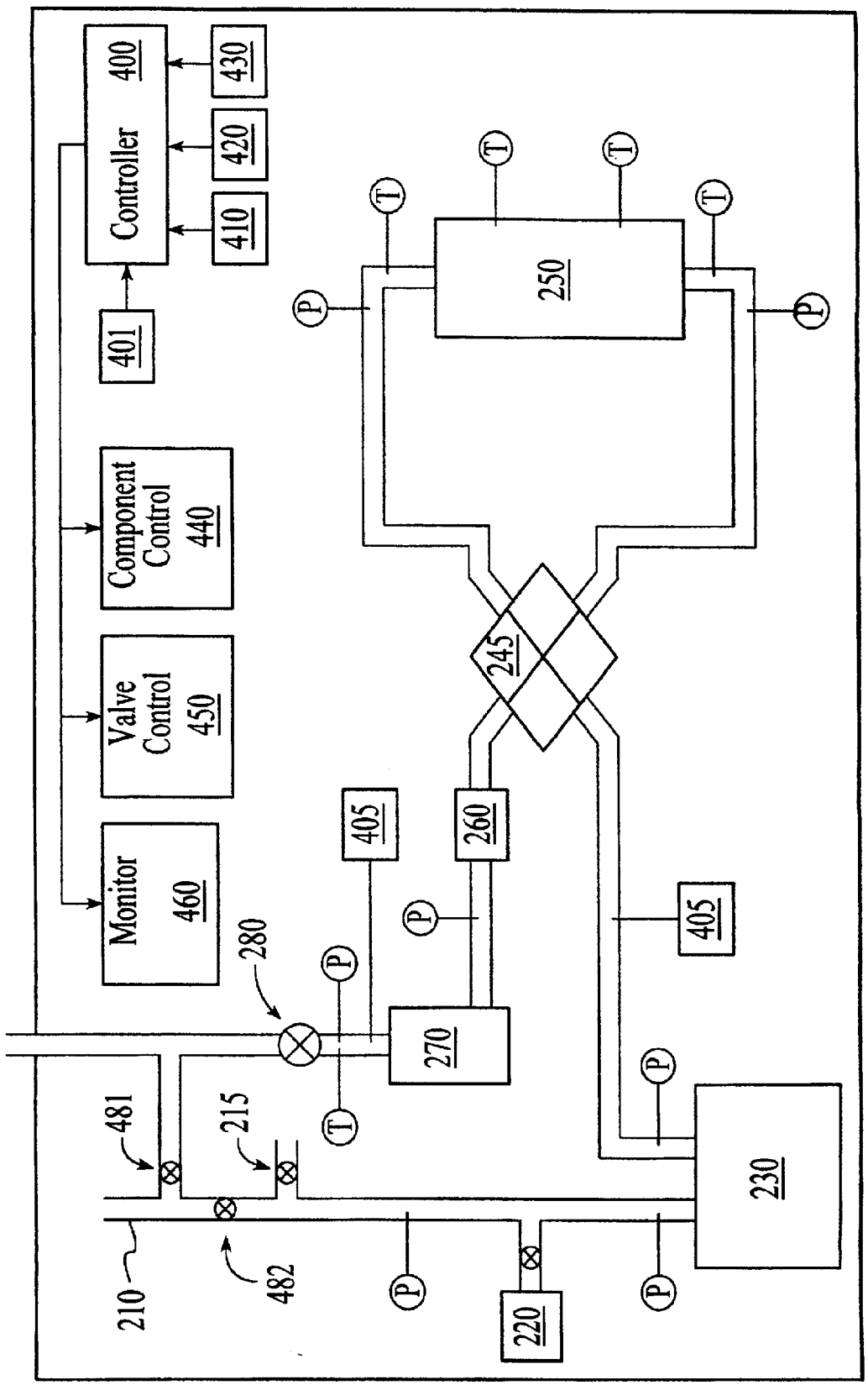
FIG. 13 is a schematic sectional side view of a version of a control system which can be used with an abatement system.

The components of the catalytic abatement system 200 and the temperatures of the components are controllable to assure optimal abatement of hazardous gases, including PFCs in the effluent gas, and proper functioning of the catalytic abatement system 200, as shown in FIG. 13. After passing through the catalytic abatement system 200, the effluent gas is substantially abated of hazardous gases and may be safely exhausted. In the embodiment shown in FIG. 13, the catalytic abatement system 200 comprises a control and monitoring system including a controller 400. Pressure detectors, P, and thermometers, T, may be positioned in the catalytic abatement system 200 as shown for example in FIG. 11. In addition, a gas analysis probe 405 may be positioned in the abated effluent gas stream, preferably after the scrubber 270, to analyze the gas content of the abated effluent gas 101. The gas analysis probe 405 is in communication with gas analyzer 410. Gas analyzer 410 provides gas analysis data to controller 400. An additional gas analysis probe 405 may be provided in the effluent gas stream, preferably after the prescrubber 230 to determine, for example, the presence of $SiF_4$ in the effluent gas 100. The gas analyzer 410 comprises any commercially available gas analyzer, such as for example, the RGA 300 system commercially available from Stanford Research Systems, Sunnyvale, Calif. A pressure monitor 420 and a temperature monitor 430 are in communication with the pressure detectors and the thermometers, respectively. The pressure monitor 420 and the temperature monitor 430 provide data to the controller 400 about the pressure and temperature conditions in the catalytic abatement system 200. The controller 400 controls and adjusts the operation of the catalytic abatement system 200 and of process chamber 25 in accordance with the monitored data.

In operation, the gas analyzer 410 may continuously monitor the hazardous gas content of the effluent gas emitted from the catalytic abatement system 200 and provides a continuous output signal, or a safety level output signal, that is triggered when the hazardous gas content of the effluent gas exceeds a safety level. The controller 400 comprises a computer readable medium having computer readable program code embodied therein that monitors the output signal (s) from the gas analyzer and performs at least one of the following steps: (i) adjusts the temperature of the heated effluent gas, for example by adjusting the heater 240 or furnace 340 through a component control system 440, (ii) adjusts the quantity or composition of the additive gas by operating a valve control system 450, (iii) adjusts process conditions in the process chamber 25, (iv) terminates a process in the process chamber 25; (v) diverts the flow of effluent gas from the process chamber 25 away from the catalytic abatement system 200 by causing the valve control system 450 to open diversion valve 481 and close abatement valve 482, and (vi) provides an alarm signal to notify an operator of dangerously high levels of hazardous gas in the effluent gas or of an inoperative condition in the catalytic abatement system 200 through a monitor 460 or a separate alarm. Similar steps can be taken when undesirable products are detected in the effluent gas 100 leaving the prescrubber 230. Step (v) above is advantageous in that it allows for the catalytic abatement system 200 to be changed periodically or during inoperativeness without shutting down the substrate processing in the chamber 25.

Additionally, the controller 400 can be designed to continuously monitor the pressures and resulting effluent gas flows within the catalytic abatement system 200. When a particular pressure reading falls above or below an acceptable level, adjustment can be made through, for example, valve control system 450 or component control system 440 to open or close valves or to alter an exhaust blower 280 to adjust the pressure. The exhaust blower 280 may be an exhaust pump or a venturi device, or the like. The controller 400 may also continuously monitor the temperature throughout the catalytic abatement system 200 to maintain an optimum temperature of the effluent gas 100,101. The controller 400 can adjust the temperature through the component control system 440 that can, for example, adjust the temperature in the heating element 303 or the amount of cold water quenching in the cooling system 260.

The controller 400 may operate the process chamber 25 and catalytic abatement system 200 and may comprise a computer program code product that controls a computer comprising one or more central processor units (CPUs) interconnected to a memory system with peripheral control components, such as for example, a PENTIUM microprocessor, commercially available from Intel Corporation, Santa Clara, Calif. The CPUs of the controller 400 can also comprise ASIC (application specific integrated circuits) that operate a particular component of the chamber 25 or the catalytic abatement system 200. The interface 401 between an operator and the controller 400 may be a CRT monitor and a light with a light sensor in the tip of the pen. To select a particular screen or function, the operator touches a designated area of the CRT monitor and pushes a button on the pen. The area touched changes its color or a new menu or screen is displayed to confirm the communication between the light pen and the CRT monitor. Other devices, such as a keyboard, mouse or pointing communication device can also be used to communicate with the controller 400.

The computer program code operating the CPU(s) and other devices of the computer can be written in any conventional computer readable programming language, such as for example, assembly language, C, C$^{++}$, or Pascal. Suitable program code is entered into a single file, or multiple files, using a conventional text editor and stored or embodied in a computer-usable medium, such as a memory system of the computer. If the entered code text is in a high level language, the code is compiled to a compiler code which is linked with an object code of precompiled windows library routines. To execute the linked and compiled object code, the system user invokes the object code, causing the computer to load the code in memory to perform the tasks identified in the computer program.

The computer program code comprises one or more sets of computer instructions that dictate the timing, process gas composition, chamber pressure and temperature, electromagnetic power levels inside the chamber, susceptor positioning, and other parameters of the process chamber 25. The computer program instruction set also controls operation of the catalytic abatement system 200, the flow levels and composition of additive gas introduced through the system, and the alarms and other safety operational modes of the catalytic abatement system 200 or process chamber 25 that are triggered by a predefined concentration of hazardous gas in the effluent gas, or by the presence of a toxic hazardous gas even in minute trace levels in the effluent gas.

Figure 14:
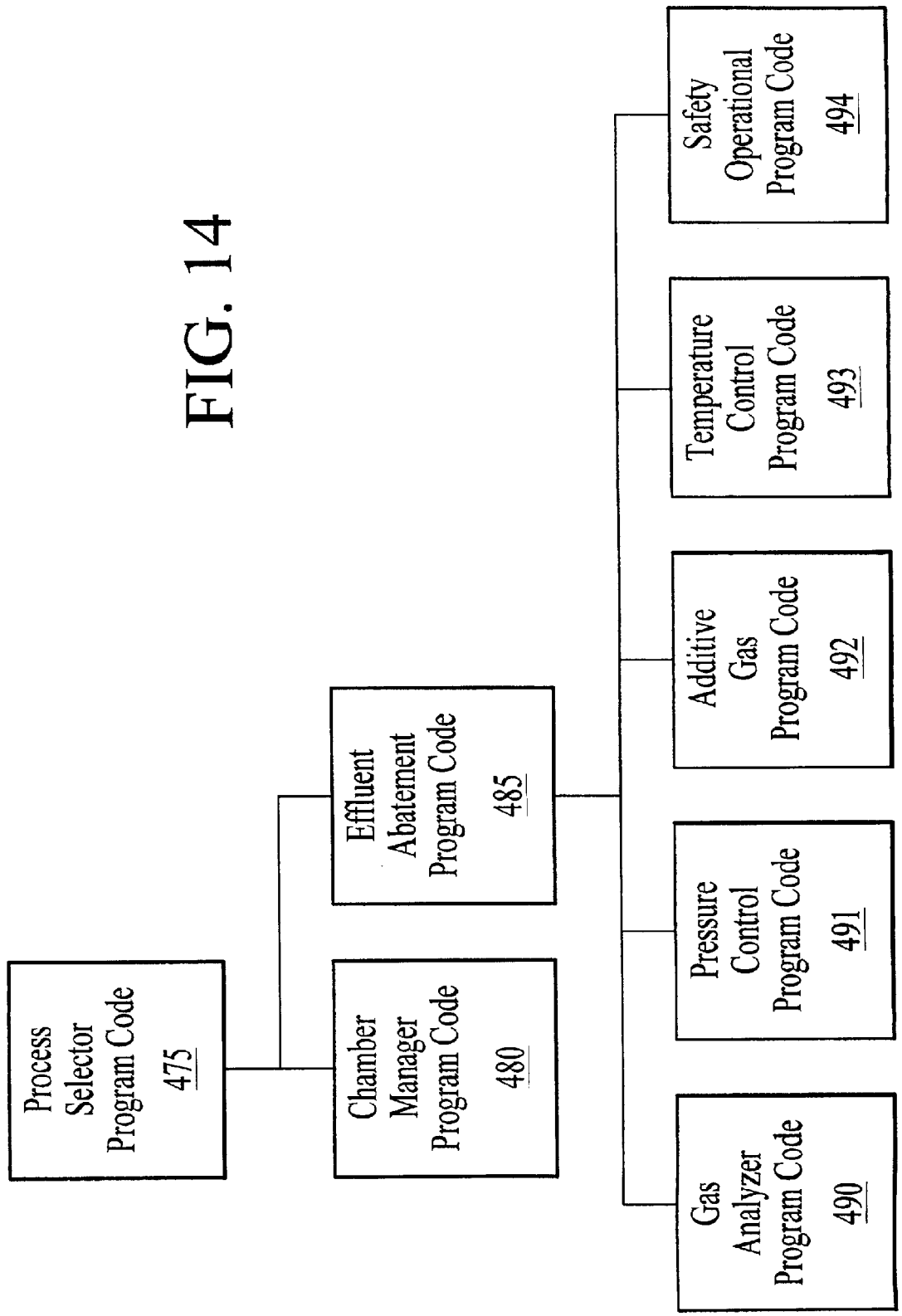
FIG. 14 is a diagram of a version of controller program code which can be used to control an abatement system.

A preferred version of the computer program code, as illustrated in FIG. 14, comprises multiple sets of program code instructions, such as a process selector and sequencer program code 475 that allows an operator to enter and select a process recipe, and that executes operation of the process recipe in a selected process chamber 25, chamber manager program code 480 for operating and managing priorities of the chamber components in the process chamber 25, and effluent abatement program code 485 for operating the catalytic abatement system 200. While illustrated as separate program codes that perform a set of tasks, it should be understood that these program codes can be integrated, or the tasks of one program code integrated with the tasks of another program code to provide a desired set of tasks. Thus the controller 400 and program code described herein should not be limited to the specific embodiment of the program codes described herein, and other sets of program code or computer instructions that perform equivalent functions are within the scope of the present invention.

In operation, a user enters a process set and process chamber number into the process selector program code 475 via the video interface terminal 401. The process sets are composed of process parameters necessary to carry out a specific process in the chamber 25, and are identified by predefined set numbers. The process selector program code 475 identifies a desired process chamber, and the desired set of process parameters needed to operate the process chamber for performing a particular process. The process parameters include process conditions, such as for example, process gas composition and flow rates, chamber temperature and pressure, plasma parameters such as microwave or RF bias power levels and magnetic field power levels, cooling gas pressure, and chamber wall temperature.

The process selector program code 475 executes the process set by passing the particular process set parameters to the chamber manager program code 480 which control multiple processing tasks in process chamber 25 or in different process chambers according to the process set determined by the process selector program code 475. For example, the chamber manager program code 480 comprises program code for etching a substrate or depositing material on a substrate in the chamber 25. The chamber manager program code 480 controls execution of various chamber component program code instructions sets which control operation of the chamber components. Examples of chamber component control program code include substrate 30 positioning instructions sets that control robot components that load and remove the substrate 30 onto the support 40, process gas control instruction sets that control the composition and flow rates of process gas supplied into the chamber 25, pressure control instruction sets that set the size of the opening of the throttle valve 82, and plasma control instruction sets that control the power level of the plasma activator 60. In operation, the chamber manager program code 480 selectively calls the chamber component instruction sets in accordance with the particular process set being executed, schedules the chamber component instruction sets, monitors operation of the various chamber components, determines which component needs to be operated based on the process parameters for the process set to be executed, and causes execution of a chamber component instruction set responsive to the monitoring and determining steps.

The effluent abatement program code 485 comprises program code instruction sets for monitoring the concentration of predefined hazardous gases in the effluent gas stream, and operating the process chamber or gas treatment components in relationship to the hazardous gas content/ composition in the effluent gas stream. A preferred structure of the effluent abatement program code 485 comprises (i) gas analyzer program code 490 for receiving the output signals of the hazardous gas content and composition (or safety level output signal) from the gas analysis probe or probes 405 and storing the output signals in an Effluent Gas Composition Table that is periodically surveyed by the other program code instruction sets, (ii) pressure control program code 491 for operating the valve control system 450 and/or the component control system 440 to control pressure and flow within the catalytic abatement system in relation to the output signals, (iii) additive gas program code 492 for controlling the valve control system 450, (iv) a temperature control program code 493 for controlling the temperature of the effluents 100, 101, and (v) safety operational program code 494 for monitoring the emission levels of the hazardous gas in the effluent gas, and adjusting operation of the process chamber 25 and/or the catalytic abatement system 200 to reduce or substantially eliminate the hazardous gas emissions.

The gas analyzer program code 490 monitors the composition or concentration of hazardous gas in the energized effluent gas as determined by the gas analyzer 410, and receives the output signals of the hazardous gas content and composition (or the safety level output signal) from the gas analysis probe 405. The gas analyzer program code 490 stores the output signals in an Effluent Gas Composition Table that is periodically surveyed by the other program code instruction sets. Alternatively, or in combination with the storage function, the gas analyzer program code 490 passes a safety level output signal to other program code instructional sets, when the hazardous gas content in the effluent gas exceeds a predefined operational safety level. The gas analyzer program code 490 can also be integrated into the gas analyzer 410, instead of being resident in the controller 400. The gas analyzer code 490 may cause adjustments through the valve control system 450 and/or the component control system 440 as discussed above.

The pressure control program code 491 includes program code instruction sets for adjusting the pressure in the catalytic abatement system 200 in response to signals passed by the pressure detectors and pressure monitor 420. When a pressure falls above or below a predetermined value, the pressure control program code can control operation of the valves through valve control system 450 or control operation of the exhaust blower 280 through component control system 440 to make the necessary pressure adjustments.

The additive gas program code 492 includes program code instruction sets for controlling the effluent gas composition by controlling the gas, air and/or water supplies through valve control 450. Typically, the additive gas program code 492 adjusts the opening of one or more additive gas valves in response to the output signals passed by the controller 400. In addition, the additive gas program code 492 can operate in conjunction with the gas analyzer program code 490. When an increase in hazardous gas content is detected, the additive gas program code 492 energizes a flow, or increases a flow rate, of reagent gas into the catalytic abatement system 200 to further reduce the hazardous gas emissions.

The temperature control code 493 includes program code that responds to temperature readings to maintain the temperature of the effluent gases 100, 101 at an optimal level for hazardous gas destruction by for example controlling the temperature of the heating element 303 through component control system 440 or by controlling the cooling system 260.

The safety operational program code 494 operates in conjunction with the other program code instruction sets to adjust operation of the process chamber components or the gas treatment apparatus in relation to the levels of hazardous gas in the effluent gas stream to reduce or eliminate the hazardous gas emissions. For example, the safety operational program code 494 can be programmed to shut-down operation of the process chamber 25 upon detection of a predefined concentration of hazardous gas in the exhaust effluent, or of the presence of toxic hazardous gas even in minute trace levels in the effluent gas. Typically, when toxic gases are used in the processing of the substrate, several safety shut-off valves are on each gas supply line of the gas distributor 72, in conventional configurations. The safety operational program code 493 provides a trigger signal to the process gas control instructions set of the chamber manager program code 480 to close the safety shut-off valves when the concentration of hazardous gas in the effluent gas reaches a predefined level. Alternatively, the safety operational program code 494 can divert the flow of effluent gas to the exhaust or to another abatement system, as discussed above. Conversely, when the safety operational program code 494 receives a low or zero emissions level signal from the output of the gas analyzer 410, the program code provides a control signal that instructs the chamber manager program code 480 to continue to operate the process chamber 25 in the current operational mode, and that also instructs the effluent abatement program code 485 to continue to operate the catalytic abatement system 200 in its current operational mode.

In operation, the safety operational program code 494 repeatedly reads the latest effluent gas composition in the Effluent Gas Composition Table, compares the readings to a signal from the mass flow controllers controlling process gas flow into the chamber 25, and sends instructions to adjust the flow rates of the process gas as necessary to reduce or entirely eliminate the hazardous gas emissions in the effluent gas. Alternatively, the safety operational program code 494 performs these operations when it receives a safety level output signal. Typically, this program code is set to 0.9 operate when the concentration of hazardous gas in the effluent gas exceeds a predetermined value, such as a concentration of from about 0.1% to about 10%.

In another example, the safety operational program code 494 can also operate an alarm or an indicator, such as a LED light, to indicate a dangerous level of toxic or hazardous gas in the effluent gas stream; or provide a metering display, such as a graphic real-time image that shows in real time the level of emissions of hazardous gas for monitoring by an operator. This safety feature allows an operator to monitor and prevent accidental emissions of hazardous gas into the atmosphere. The same signal can be used to maintain the processing apparatus 25 in a non-operational mode, or to energize the safety shut-off valves when an unsafe process condition is detected. In this manner, the safety operational program code 494 operates the process chamber and the gas treatment apparatus to provide an environmentally safe apparatus.

The catalytic abatement system 200 may be a self-contained and integrated unit that is compatible with various process chambers 25. The catalytic abatement system 200 can be used to destroy a large variety of hazardous gases, including substantially all types of PFCs. The catalytic abatement system 200 has no impact on process chamber 25 operation and may be used with any process chamber that exhausts hazardous gases. The catalytic abatement system is convenient to handle and occupies less than 40 cubic feet.

Although the present invention has been described in considerable detail with regard to certain preferred versions thereof, other versions are possible. Furthermore, although the described invention is particularly useful in treating a hazardous effluent gas, other uses of the invention are possible. Therefore, the appended claims should not be limited to the description of the preferred versions and uses contained herein.

What is claimed is:

1. An effluent gas treatment apparatus comprising:
a catalytic reactor having an effluent gas inlet and an effluent gas outlet, the catalytic reactor comprising (i) an inner wall about an internal chamber, and (ii) an outer wall radially external to the inner wall and defining an outer reactor region therebetween, wherein the inner and outer walls at least partially define a convoluted effluent gas flow path through the outer reactor region and internal chamber; and
a heater adapted to heat an effluent gas in the catalytic reactor,
whereby effluent gas introduced through the effluent gas inlet is treated while flowing through the catalytic reactor to the effluent gas outlet.

2. An apparatus according to claim 1 wherein the heater is in the catalytic reactor.

3. An apparatus according to claim 1 wherein the heater is within an effluent gas flow path in the catalytic reactor.

4. An apparatus according to claim 1 wherein the heater is adapted to heat the effluent gas to a temperature of at least about 700° C.

5. An apparatus according to claim 1 wherein the catalytic reactor comprises an internal wall adapted to change the direction of the effluent gas flow path in the reactor.

6. An apparatus according to claim 1 further comprising a scrubber capable of scrubbing the effluent gas, the scrubber comprising internal surfaces having a pH of at least about 8.

7. A substrate processing apparatus comprising:
(i) a process chamber to process a substrate in an energized gas, the chamber comprising:
(a) a substrate support;
(b) a gas supply to introduce a gas into the chamber;
(c) a gas energizer to energize the gas to process a substrate or clean the chamber and thereby generate an effluent gas; and
(d) an exhaust system to exhaust the effluent gas from the chamber; and
(ii) a gas treatment apparatus to reduce a hazardous gas content of effluent gas exhausted from the chamber, the gas treatment apparatus comprising:
(a) a conduit to receive the effluent gas from the exhaust system;
(b) a catalytic reactor having an effluent gas inlet to receive the effluent gas from the conduit and an effluent gas outlet; and
(c) a heater adapted to heat effluent gas In the catalytic reactor, whereby the effluent gas introduced through the effluent gas inlet is treated while flowing through the catalytic reactor to the effluent gas outlet.

8. An apparatus according to claim 7 wherein the heater is in the catalytic reactor.

9. An apparatus according to claim 7 wherein the heater is within an effluent gas flow path in the catalytic reactor.

10. An apparatus according to claim 7 wherein the catalytic reactor comprises an internal wall adapted to change the direction of the effluent gas flow path in the reactor.

11. An apparatus according to claim 10 comprising a plurality of internal wells.

12. An apparatus according to claim 7 further comprising a scrubber capable of scrubbing the effluent gas, the scrubber comprising internal surfaces having a pH of at least about 8.

13. An effluent gas treatment apparatus comprising:
a scrubber capable of treating on effluent gas, the scrubber comprising a surface having a pH of at least about 8;
a heater adapted to heat the effluent gas; and
a catalytic reactor having an effluent gas inlet and an effluent gas outlet, the catalytic reactor comprising (i) an inner wall about an internal chamber, and (ii) an outer wall radially external to the inner wall and defining an outer reactor region therebetween, wherein the inner and outer walls at least partially define a convoluted effluent gas flow path through the outer reactor region and internal chamber,
whereby effluent gas introduced through the effluent gas inlet is treated while flowing through the catalytic reactor to the effluent gas outlet.

14. An apparatus according to claim 13 wherein the surface is on one or more beads.

15. An apparatus according to claim 14 wherein the one or more beads comprise at least about a 3% moisture content.

16. An apparatus according to claim 13 further comprising an additive gas source.

17. A substrate processing apparatus comprising:
(i) a process chamber to process a substrate in an energized gas, the chamber comprising:
(a) a substrate support;
(b) a gas supply to introduce a gas into the chamber;
(c) a gas energizer to energize the gas to process a substrate or clean the chamber and thereby generate an effluent gas; and
(d) an exhaust system to exhaust the effluent gas from the chamber; and
(ii) a gas treatment apparatus to reduce a hazardous gas content of effluent gas exhausted from the chamber, the gas treatment apparatus comprising:
(a) a conduit to receive the effluent gas from the exhaust system;
(b) a catalytic reactor having an effluent gas inlet to receive the effluent gas from the conduit and an effluent gas outlet, the catalytic reactor comprising (i) an inner cyclindrical wall about an internal catalytic chamber, and (ii) an outer cylindrical wall that is radially external to the inner wall and defines an outer rector region therebetween, wherein the inner and outer walls at least partially define a convoluted effluent gas flow path through the outer reactor region and internal chamber;
(c) a heater adapted to heat the effluent gas in the internal catalytic chamber and the outer reaction region; and
(d) a controller adapted to control the heater to heat the effluent gas in the catalytic reactor to a preselected temperature, whereby effluent gas introduced through the effluent gas inlet is heated while flowing through the catalytic reactor to the effluent gas outlet.

18. An apparatus according to claim 17 wherein the heater is in the catalytic reactor.

19. An apparatus according to claim 17 wherein the controller is adapted to control the heater to heat the effluent gas to at least about 700° C.

20. An apparatus according to claim 17 wherein the controller is further adapted to introduce an additive gas into the effluent gas.

21. An apparatus according to claim 1 wherein the heater is adapted to heat the effluent gas in both the outer reactor region and internal chamber.

22. An apparatus according to claim 1 wherein the inner and outer walls comprise cylindrical walls about a central axis.

23. An apparatus according to claim 1 wherein the catalytic reactor comprises catalytic surfaces therein that catalyze a reaction to reduce a hazardous gas content in the effluent gas.

* * * * *